(12) United States Patent
Varrey et al.

(10) Patent No.: US 12,557,230 B1
(45) Date of Patent: Feb. 17, 2026

(54) LATCH FOR RETAINING STACKED EXPANSION CARDS

(71) Applicant: AMD Design, LLC, Wilmington, DE (US)

(72) Inventors: Mahesh Kumar Varrey, Secaucus, NJ (US); Chen An, Secaucus, NJ (US); James Dmitry Iofe, Secaucus, NJ (US)

(73) Assignee: AMD Design, LLC, Wilmington, DE (US)

( * ) Notice: Subject to any disclaimer, the term of this patent is extended or adjusted under 35 U.S.C. 154(b) by 499 days.

(21) Appl. No.: 18/154,179

(22) Filed: Jan. 13, 2023

(51) Int. Cl.
  *H05K 7/14* (2006.01)
  *F16M 13/02* (2006.01)

(52) U.S. Cl.
  CPC ........... *H05K 7/1404* (2013.01); *F16M 13/02* (2013.01)

(58) Field of Classification Search
  CPC ...................................................... F16M 13/02
  USPC ................................................. 361/801, 803
  See application file for complete search history.

(56) References Cited

U.S. PATENT DOCUMENTS

| | | | | |
|---|---|---|---|---|
| 11,445,629 | B2 * | 9/2022 | Hsieh | H05K 7/12 |
| 2017/0108891 | A1 * | 4/2017 | Hua | G06F 1/185 |
| 2017/0292550 | A1 * | 10/2017 | Wang | F16B 5/065 |
| 2022/0066519 | A1 * | 3/2022 | Chang | F16B 5/0635 |
| 2022/0316508 | A1 * | 10/2022 | Wang | F16B 5/0635 |
| 2024/0130066 | A1 * | 4/2024 | Lin | G06F 1/185 |

* cited by examiner

*Primary Examiner* — Allen L Parker
*Assistant Examiner* — Peter Krim
(74) *Attorney, Agent, or Firm* — Dergosits & Noah LLP; Todd A. Noah

(57) ABSTRACT

A latch is provided for holding stacked expansion boards above a mother board that includes an auto-lock feature that triggers when an expansion board is installed and is reset when the board is removed. The latch includes a trigger arm above which a first latch slider and a second latch slider are stacked. Movement of the trigger arm caused by placement of an expansion board releases the first latch slider to an extended position that holds the expansion board in place. Downward movement of a second expansion board against the second latch slider forces the second latch slider back until the second expansion board is received by a gap between the first and second latch sliders.

20 Claims, 11 Drawing Sheets

LATCH FOR RETAINING STACKED EXPANSION CARDS

FIELD OF THE INVENTION

The present subject matter relates generally to latches, and more particularly to latches for retaining expansion cards.

BACKGROUND

The typical market solution for latching double stacked M.2 expansion cards is not intuitive, which may result in installation errors. FIG. 1 is a figure of a prior art M.2 expansion card 20, e.g., an SSD, with a latch end 22 and a connector end 24. Latch end 22 includes a notch 26. FIG. 2A . . . FIG. 2F illustrate a proper installation of expansion cards 20a, 20b, in a prior-art latch 30 connected atop a motherboard 10. Latch 30 includes a lower latch slider 33 and an upper latch slider 36. To install card 20a, in FIG. 2, a lever 32 connected to lower latch slider 33 is pulled in direction 146, revealing a lip 34. In FIG. 2B, card 20a is brought down in direction 144 against lip 34 with notch 26a aligned with slider 33. In FIG. 2C, lever 32 is moved in direction 145, causing lower latch slider 33 to slide over card 20a. In this motion, a part (not shown) of lower latch slider 33 enters notch 26a, hindering lateral motion of card 20a. In FIG. 2D, a second expansion card 20b is brought down 144 against a chamfer 37 of upper latch slider 36. In FIG. 2E, with sufficient force, card 20b has been forced to travel down along chamfer 37, causing upper latch slider 36 to retract in direction 146 and card 26b to bottom out against an upper section of lower latch slider 33. In FIG. 2F, after card 20b has bottomed out, upper latch slider 36 is forced in direction 145, into an extended latch position in which card 20b is retained by upper latch slider 36 in a slot 38 (FIG. 3A) in the same manner card 20a is retained by lower latch slider 33 in a slot 35 (FIG. 3A).

FIG. 3A is a side view illustrating a prior-art apparatus in which cards 20a, 20b are incorrectly installed. In FIG. 3A, an operator has properly installed card 20a in a slot of a board connector 40. However, in bringing card 20a against latch 30, the operator has not used lever 32 to withdraw lower latch slider 33. This resulted in card 20a entering gap 38. Thus, when the operator subsequently slotted card 20b into board connector 40 and brought card 20b against chamfer 37, further force caused upper latch slider 36 to retract and card 20b to drop down against an upper edge of card 20a, where it will be retained, improperly, by the force of upper latch slider 36 against card 20b.

FIG. 3B is a side view illustrating a prior-art apparatus in which cards 20a, 20b are incorrectly installed. In FIG. 3B, an operator has properly installed card 20a in a slot of board connector 40 and in slot 35 of lower latch slider 33. However, in bringing card 20b against latch 30, the operator has not released lever 32. This resulted in card 20b bypassing gap 38 and being wedged against lower latch slider 33 after lever 32 is released.

Due to the relatively small size of cards 20a, 20b, and of latch 30—which may itself be approximately 1 cm wide—and due to the point of view typically being from above—which would show the card as seen in FIG. 1 and not the misalignment of FIG. 3A and FIG. 3B, the incorrect installations illustrated by FIG. 3A and FIG. 3B may go unnoticed by the operator.

Thus, what is needed is a latch that provides for the securing of double stacked expansion cards that is intuitive and prevents misalignment.

BRIEF DESCRIPTION OF THE DRAWINGS

The embodiments are illustrated by way of example and not limitation in the accompanying drawings, in which like references indicate similar elements, and in which.

DETAILED DESCRIPTION

Embodiments described within disclose a latch that is intuitive. To install both the upper and lower expansion card, the card is simply pressed down into the latch. Thus, embodiments, eliminate the non-intuitive nature of the prior art by eliminating the need to pull a lever to install one card and not pull the lever to install a second card. Instead, embodiments include an auto-latch feature in which the downward movement of the first card triggers the movement of a lower latch slider and, in tandem, the movement of an upper latch slider into position to receive the second expansion card. In embodiments, the slider positions are reset when the cards are removed.

Figure 1:
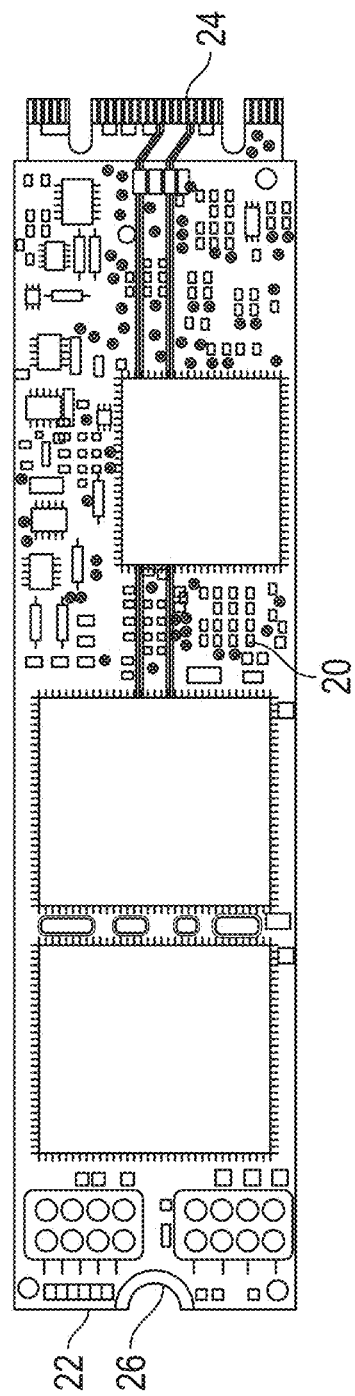
FIG. 1 is a top view of a prior-art M.2 SSD expansion card.
Figure 2A:
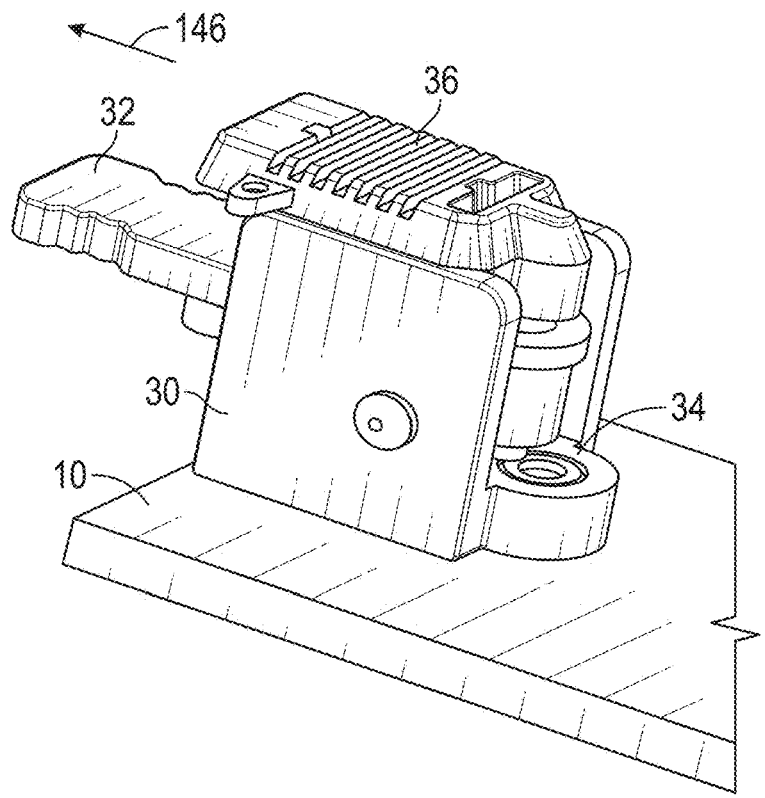
FIG. 2A-FIG. 2F are isometric perspective views of a prior-art latch for securing stacked M.2 expansion cards.
Figure 2B:
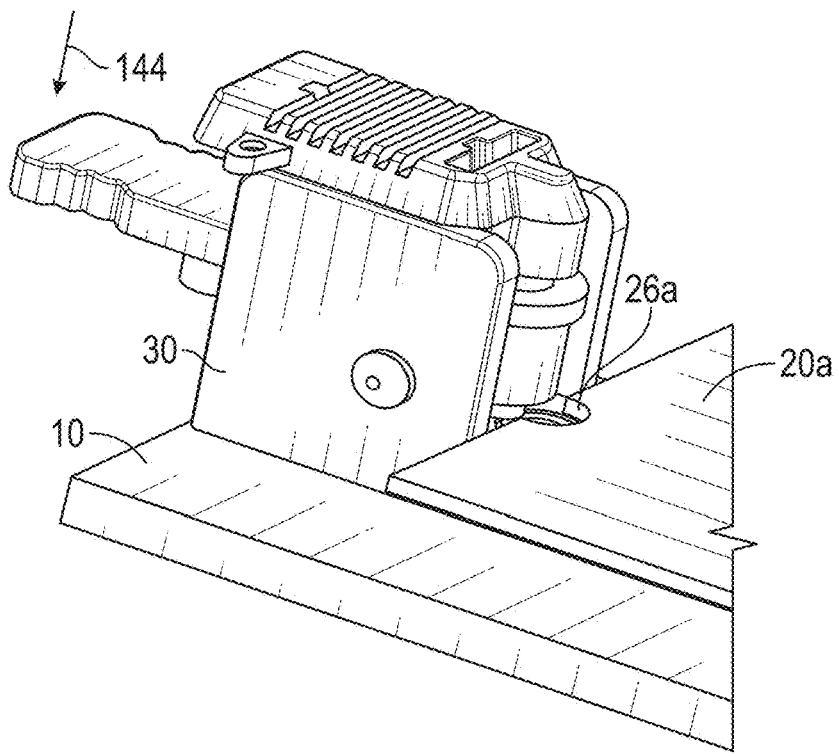
Figure 2C:
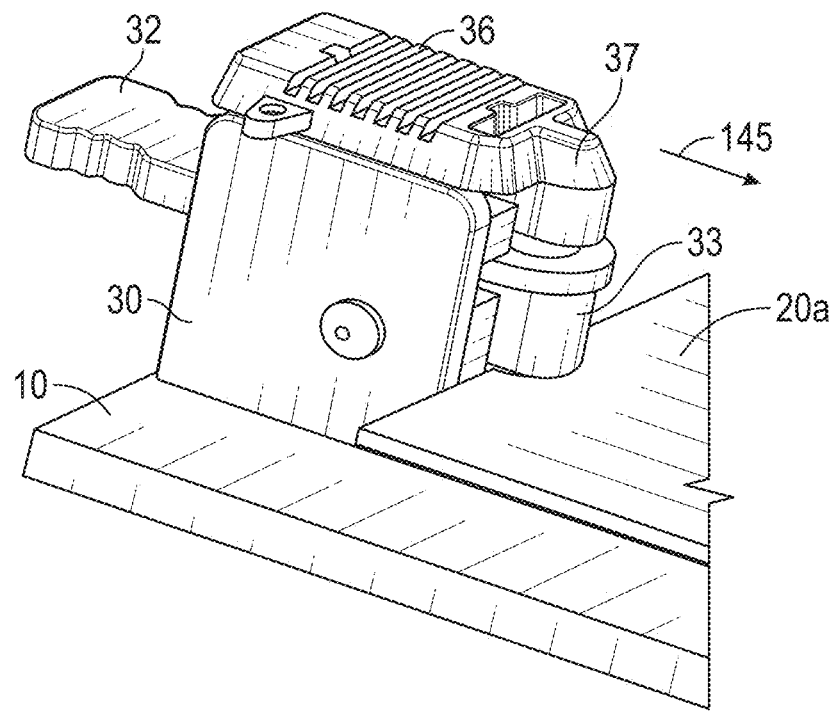
Figure 2D:
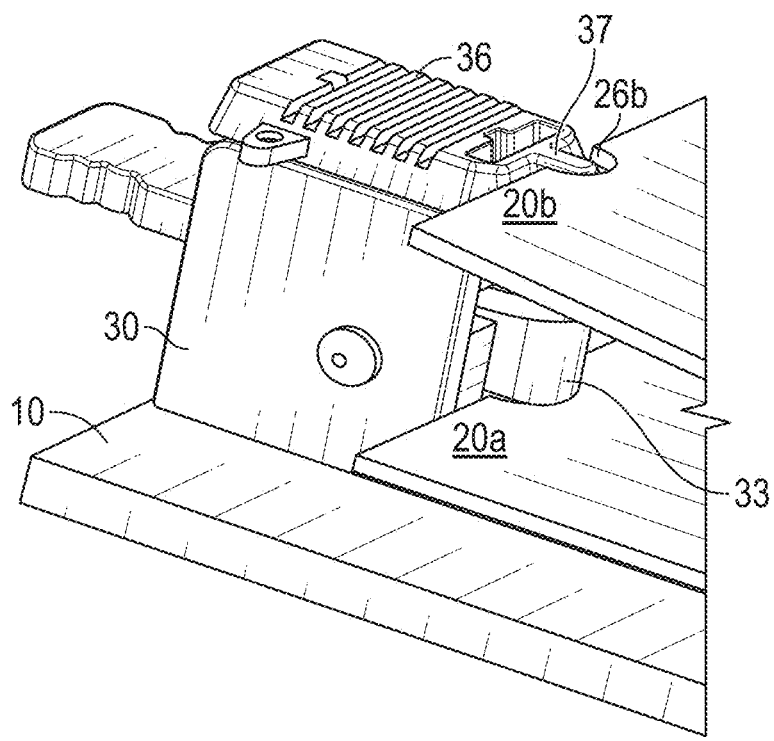
Figure 2E:
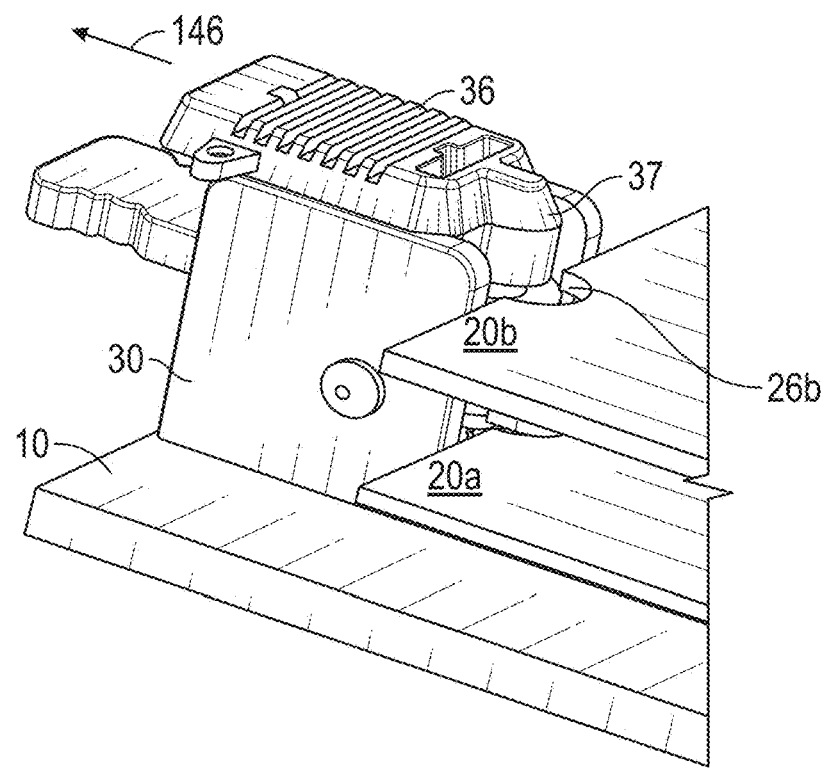
Figure 2F:
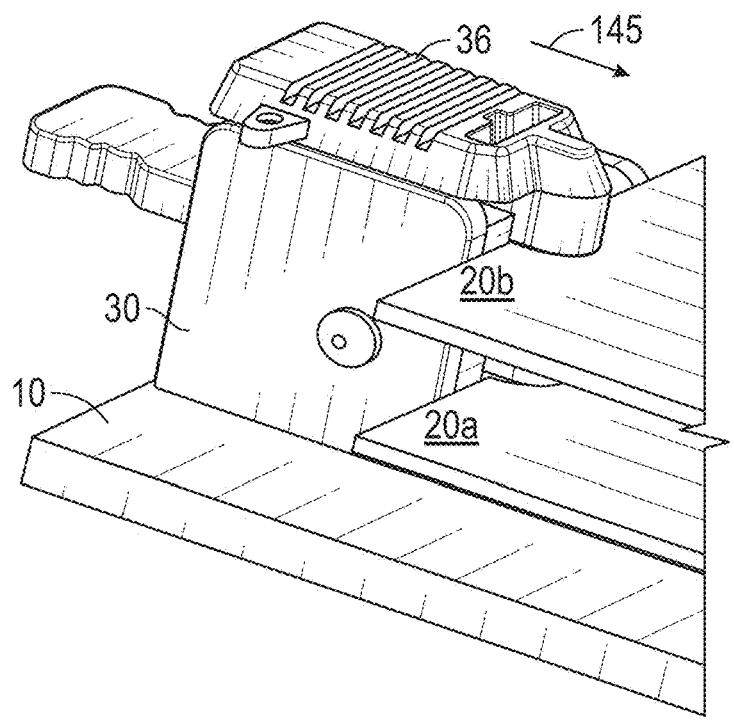
Figure 3A:
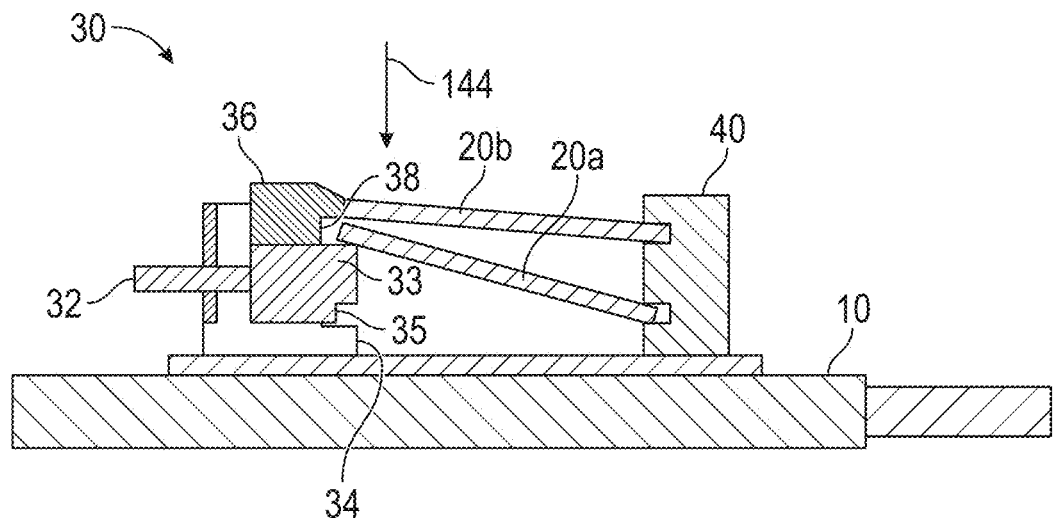
FIG. 3A and FIG. 3B are side views illustrating an incorrect installation of expansion cards in a prior-art latch.
Figure 3B:
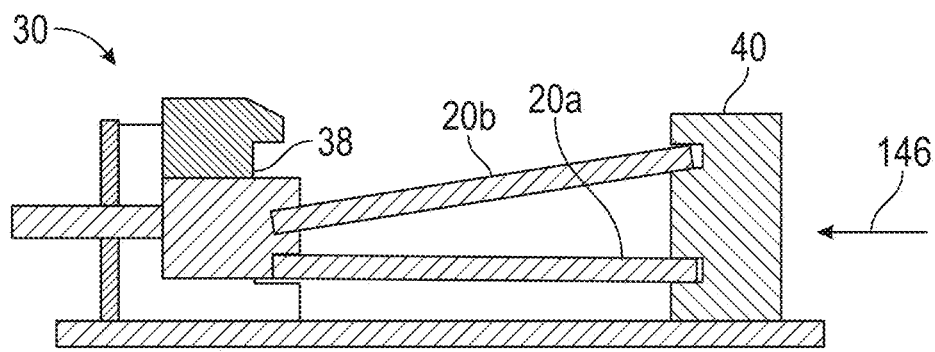
Figure 4:
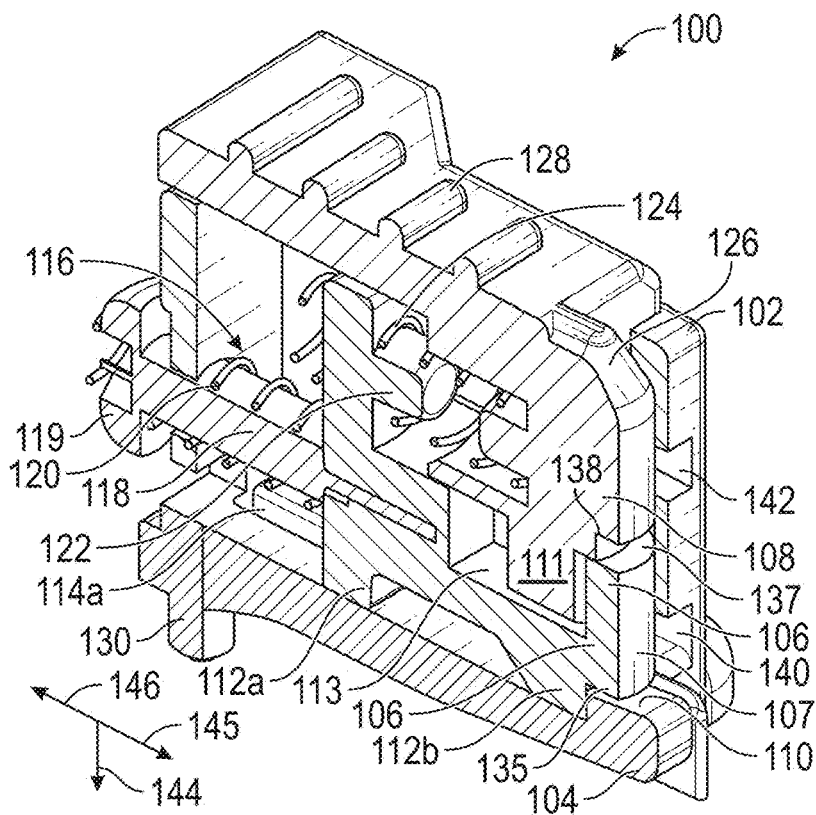
FIG. 4 is an upper front left isometric view of a cross-section of an embodiment of a latch for retaining stacked expansion cards.

FIG. 4 is an upper front left isometric view of a cross-section of an embodiment of a latch 100 for retaining stacked expansion cards. In FIG. 4, latch 100 includes a housing 102 with a space 116 which forms a latch including a trigger post 110, a lower latch 106, and an upper latch 108. Housing 102 includes lower tracks 140 and upper tracks 142, which engage corresponding track followers in lower latch slider 106 and upper latch slider 108 and constrains them to movement in directions 145, 146. In the embodiment, trigger post 110 is connected to a cantilevered arm 104, which allows trigger post 110 to move in direction 144 in response to a sufficient force. Arm 104 includes a mounting post 130 for mounting arm 104, and latch 100 in general, to board 10. The majority of arm 104 is separated from housing 102 by slots 114a, 114b. Lower latch 106 slides in direction 145, 146 with legs 112a, 112b limiting the upper movement of arm 104 and post 110. Lower latch 106 includes a lower latch face 107, a lower latch space 113, a lower edge 135, and an upper edge 137. Upper latch slider 108 includes a post 111, a chamfer 126, a grip 128, and a lower edge 138. Post 111 moves within space 113 of lower latch slider 106. Thus, as lower latch slider 106 is moved, upper latch slider 108 generally moves with it.

Figure 7A:
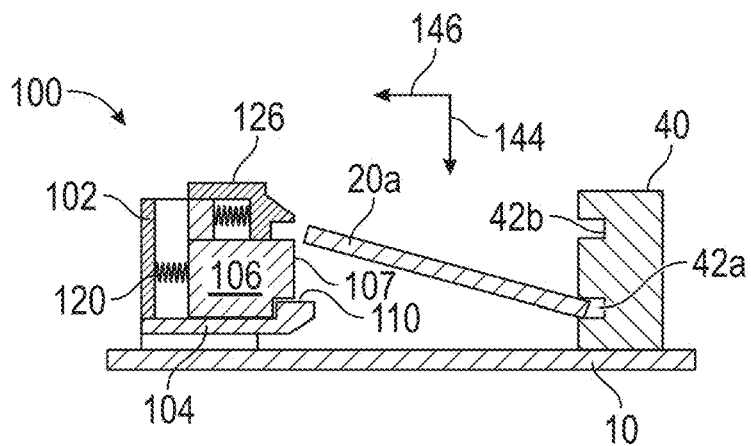
FIG. 7A-FIG. 7D are side views illustrating the installation of expansion cards in an embodiment of the embodiment of a latch for retaining stacked expansion cards of FIG. 4.
Figure 7B:
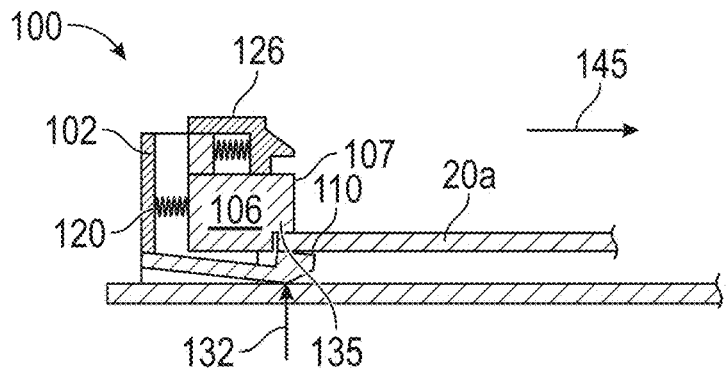

Lower latch 106 is biased to an extended position (FIG. 7B . . . FIG. 7D) by a spring 120 about a fastener 118. Lower latch 106 is maintained in the retracted position of FIG. 4 by trigger post 110, which in the raised position shown prevents leg 112b from extending in direction 145. After trigger post 110 is lowered sufficiently, leg 112b will be released and spring 120 will urge lower latch slider 106 to the extended position. A head 119 of fastener 118 may then be retracted in direction 146 further into space 116 of housing 102 to reset lower latch 106 to the retracted position of FIG. 4.

Upper latch slider 108 is biased to an extended position with respect to lower latch slider 106, as shown in FIG. 4, by a spring 124 based about a post 112 of lower latch slider 106.

In the embodiment, the forces of compressed springs 120, 124 are sized so that the force required to move upper slider 108 in direction 146 with respect to lower slider 106 is less than the force required to move lower slider 106 in direction 146 with respect to arm 104.

Figure 5:
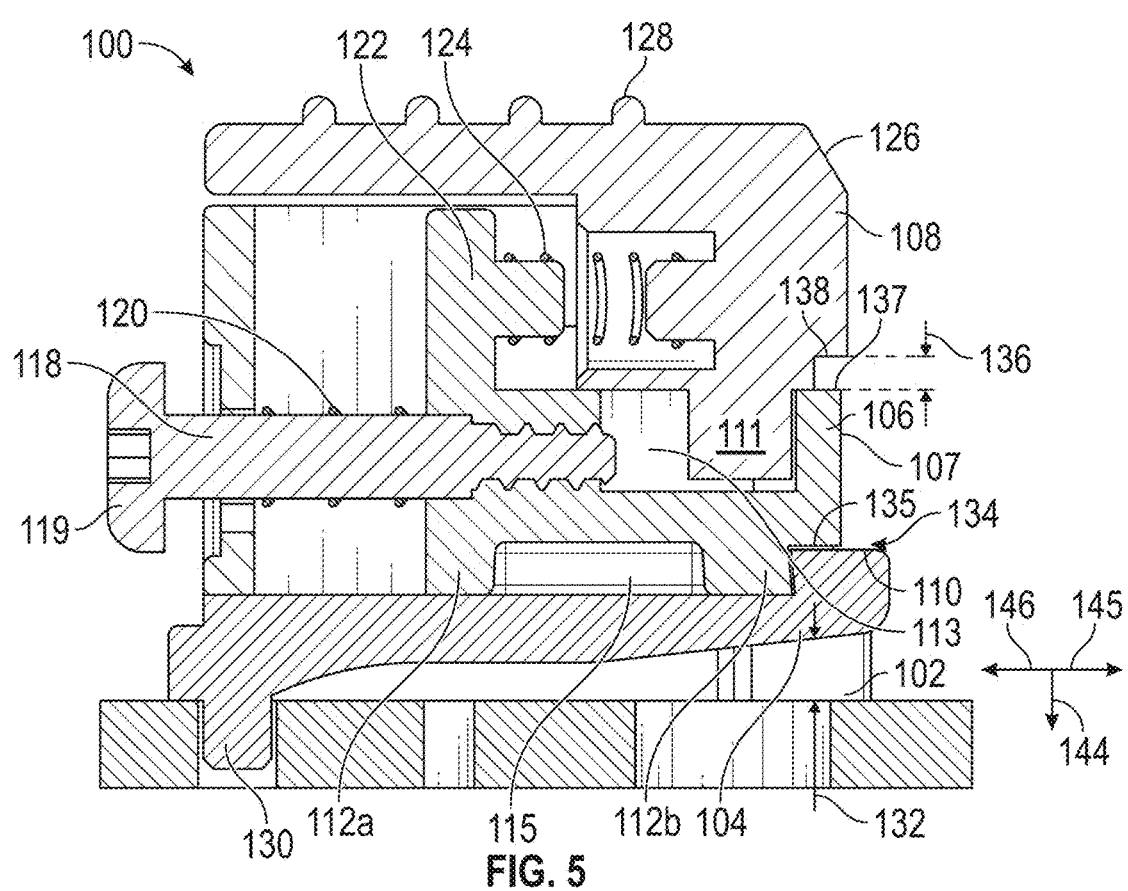
FIG. 5 is a left side view of a cross-section of the embodiment of a latch for retaining stacked expansion cards of FIG. 4.

FIG. 5 is a left side view of a cross-section of the embodiment of a latch for retaining stacked expansion cards of FIG. 4. FIG. 5 illustrates that an upper slot 136 is formed between lower edge 138 and upper edge 137. Upper slot 136 is configured to receive card 20b and maintain the end of card 20b at a desired distance above board 10. FIG. 5 illustrates a position of a lower slot 134 between lower edge 135 and trigger post 110, and that a section of trigger post 110 extends in direction 145 out from under lower edge 135. With trigger post 110 in the raised position shown, lower slot 134 is not large enough to accept card 20a. However, a gap 132 indicates the clearance available for cantilevered arm 104 and trigger post 110 to move in direction 144, which would cause lower slot 134 to increase to a size sufficient to admit card 20a. With lower slot 134 changing in dimension, it is the position of lower edge 135 that defines the desired location of the upper face of card 20a above board 10. In the embodiment, lower latch slider 106 includes a track follower 115 shown to extend into track 140. In the embodiment, arm 104, trigger post 110, lower latch 106, upper latch 108, and tracks 140, 142 are symmetrical about a center plane parallel to the face of the cross-section of FIG. 4. Thus, a second track follower 115 is included on the other side of lower latch slider 106. Upper latch slider 108 includes similar track followers, which are not shown.

Figure 6:
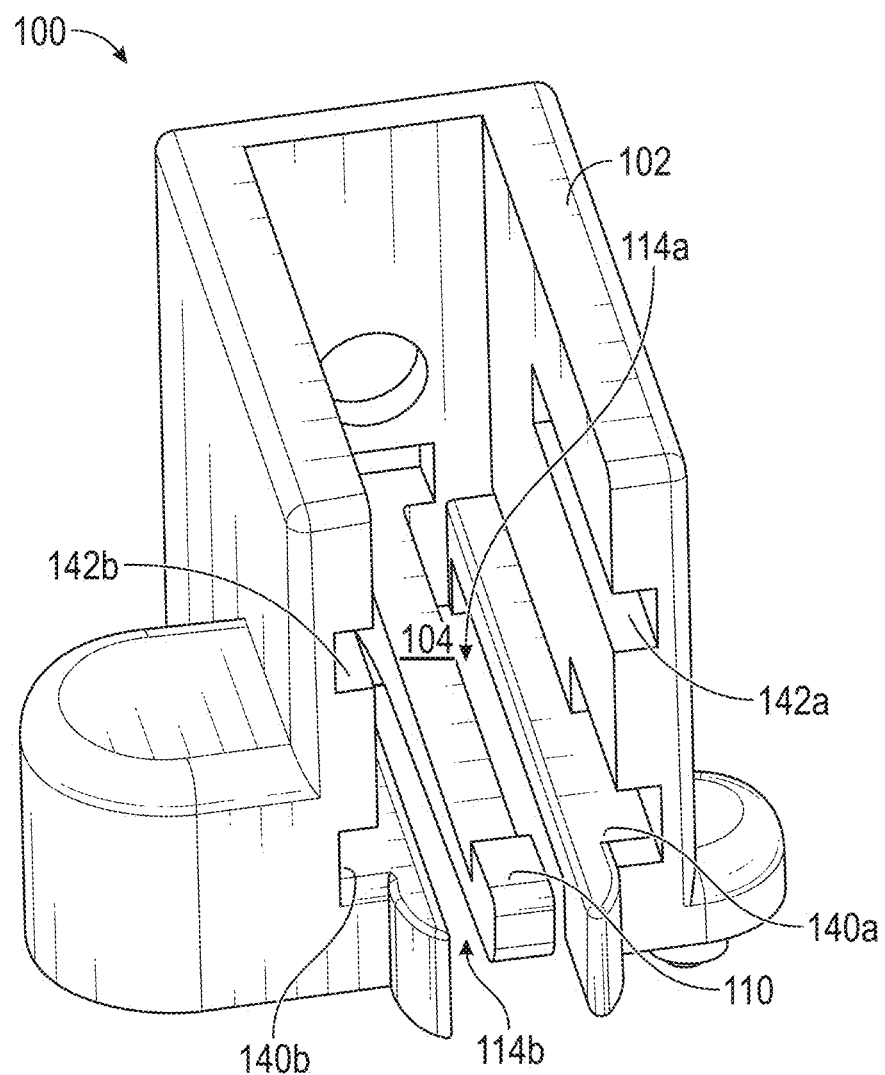
FIG. 6 is an upper front left isometric view of aspects of the embodiment of a latch for retaining stacked expansion cards of FIG. 4.

FIG. 6 is an upper front left isometric view of aspects of the embodiment of a latch for retaining stacked expansion cards of FIG. 4. In FIG. 6, housing 102 of latch 100 is shown connected to cantilevered arm 104, separated by slots 114a, 114b. Thus, to depress trigger post 110, a force sufficient to overcome cantilevered arm 104 is required. In addition, lower track 140a and upper track 142a are shown to have symmetrical counterparts 140b, 142b.

FIG. 7A . . . FIG. 7D are side views illustrating the installation of expansion cards in an embodiment of the embodiment of a latch for retaining stacked expansion cards of FIG. 4. In FIG. 7A, card 20a is initially inserted into a connector 42a of end connector 40. The other end 22 is then pressed in direction 144 against the exposed section of trigger post 110, causing arm 104 to deflect.

FIG. 7B illustrates the configuration of latch 100 after arm 104 has been deflected in direction 144 to the extent that trigger post 110 no longer constrained lower latch slider 106 and spring 120 urged lower latch slider 106 in direction 145. Thus, the movement of trigger post 110 to the downwardly-retracted position has triggered the movement of lower latch slider 106 from the retracted position of FIG. 7A to the extended position of FIG. 7B. Upper latch slider 108 has been carried forward 145 by lower latch slider 106. Lower slot 134 has been enlarged by the movement of trigger power 110 and card 20a is now received within enlarged slot 134. Correspondingly, clearance slot 132 is reduced.

Figure 7C:
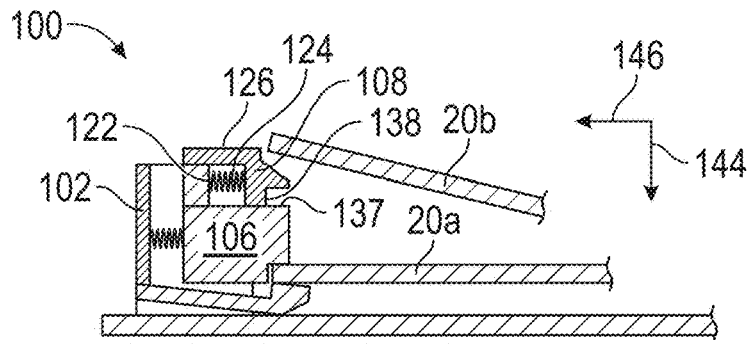
Figure 7D:
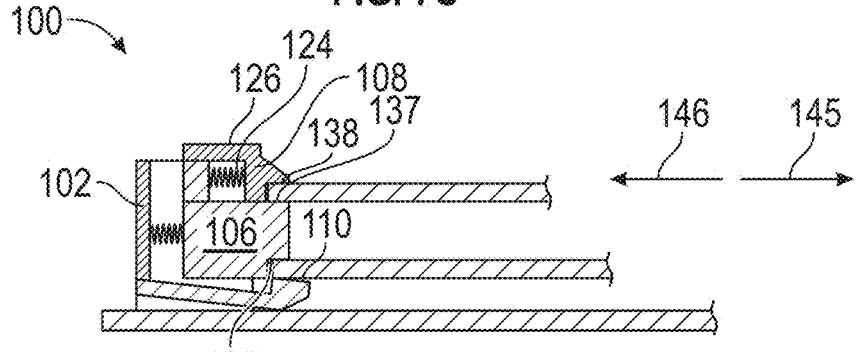

In FIG. 7C, card 20b is initially inserted into a connector 42b of end connector 40 (not shown). The other end 22 of card 22b is then pressed in direction 144 against chamfer 126 of upper latch slider 108, causing upper latch slider 108 to overcome the force of spring 124 and move in direction 146 to a retracted position that allows end 22 of card 22b to drop to rest on upper edge 137. With card 20b resting on upper edge 137, spring 124 may then urge upper latch slider 108 in direction 145 such that card 20b is received between lower edge 138 and upper edge 137 in upper slot 136.

FIG. 7D illustrates the configuration of latch 100 after card 22b has dropped to upper edge 137, upper latch slider 108 has been urged to the extended position, and end 22 of card 20b has been received within upper slot 136. As shown in FIG. 7D, cards 20a, 20b are held in parallel to board 10. To release card 20b, grip 128 may be pushed in direction 146 to overcome spring 124 and retract lower edge 138 so that card 20b may be lifted out. Further force against grip 128 in direction 146 will overcome spring 120 and retract lower edge 135 so that card 20a may be lifted out. In addition, when lower latch slider 106 is sufficiently retracted, trigger post 110 will be free to extend upwards at the urging of cantilevered arm 104, at which point latch 100 has been reset.

In summary, an installation sequence may include: 1) lower card 20a is inserted and pressed against trigger post 110; 2) trigger post 110 is depressed sufficiently that lower latch slider 106 is actuated and extends in direction 145, securing card 20a within slot 134; 3) upper card 20b is inserted and pressed against chamfer 126, causing upper latch slider to retract and upper card 20b to rest on upper edge 137; and 4) once card 20b is clear of upper latch slider 108, upper latch slider 108 is urged by spring 124 in direction 145, causing card 20b to be received within upper slot 136.

Figure 8A:
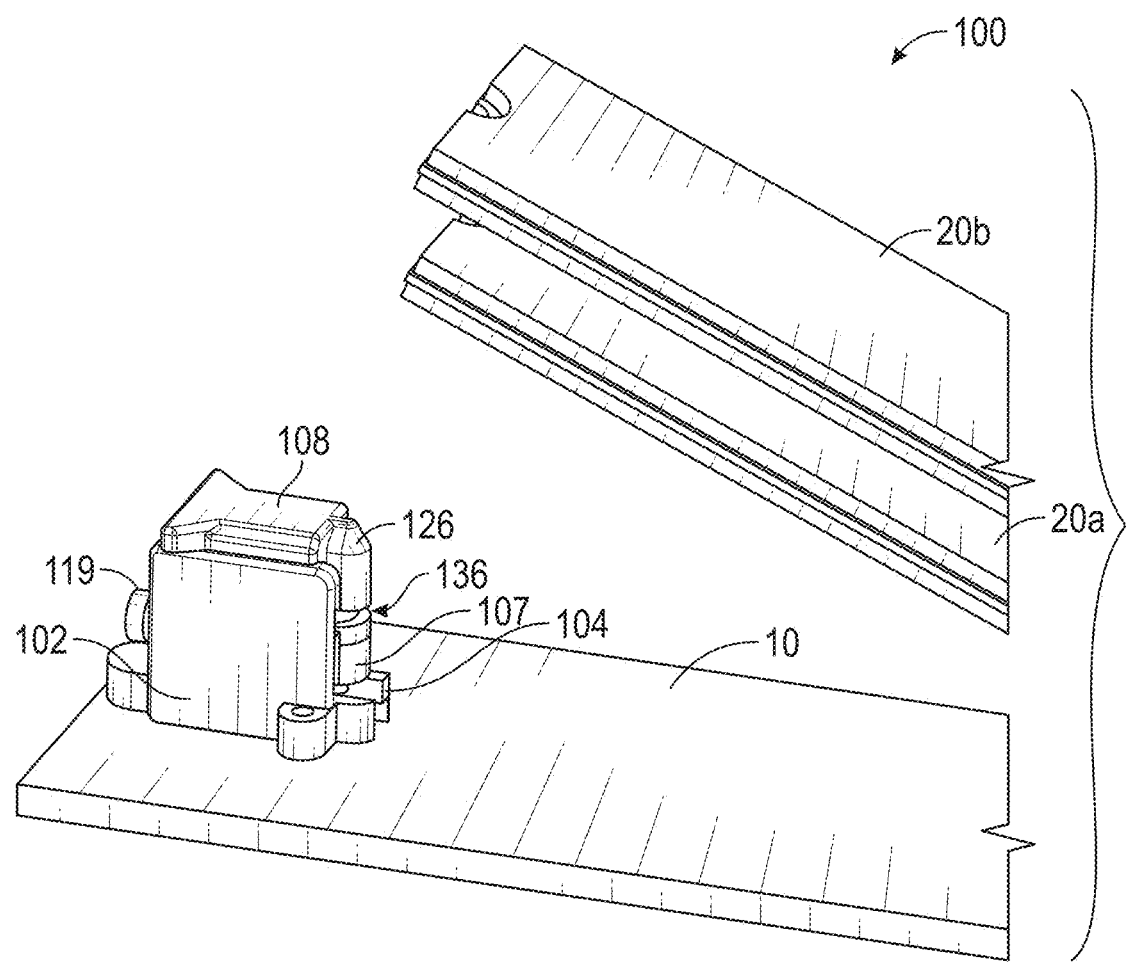
FIG. 8A and FIG. 8B are upper front left isometric views illustrating the installation of expansion cards in an embodiment of the embodiment of a latch for retaining stacked expansion cards of FIG. 4.
Figure 8B:
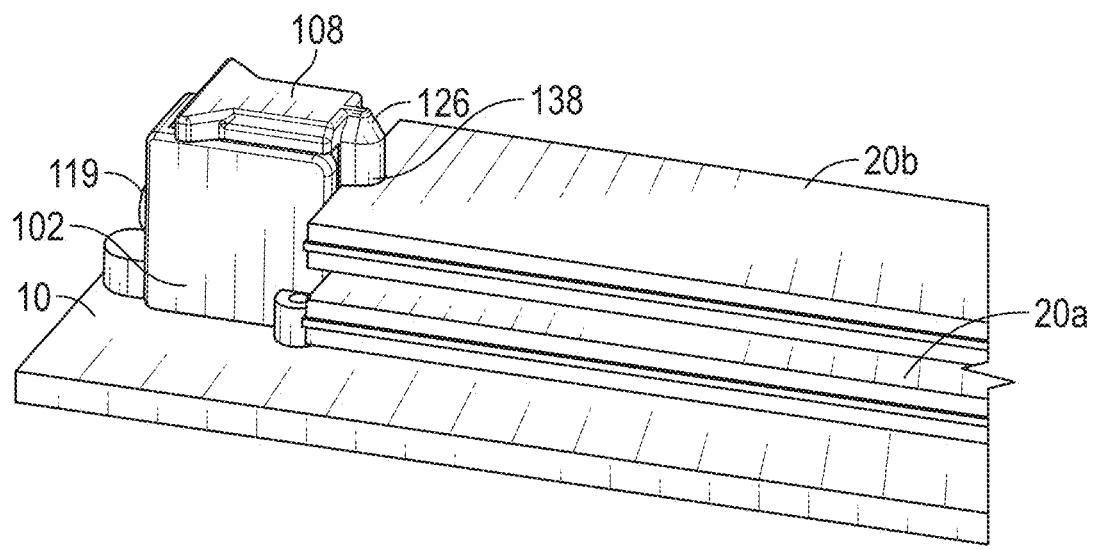

FIG. 8A and FIG. 8B are upper front left isometric views illustrating the installation of expansion cards in an embodiment of the embodiment of a latch for retaining stacked expansion cards of FIG. 4. FIG. 8A illustrates that chamfer 126 may not extend from the top of upper latch slider 108 to upper slot 136. Rather, chamfer 126 may extend only part of the way. FIG. 8B illustrates that when cards 20a, 20b are secured, upper latch slider 108 may be retracted to release upper card 20b. Then, head 119 may be retracted to release card 20a and reset latch 100.

Figure 9A:
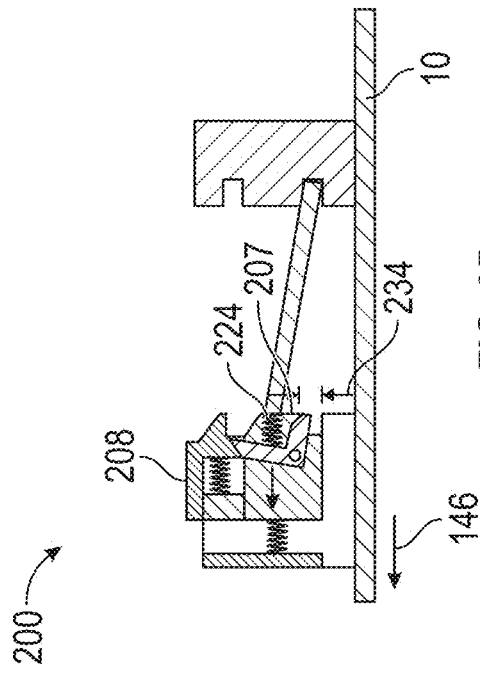
FIG. 9A-FIG. 9F are side views illustrating the installation of expansion cards in an embodiment of a latch for retaining stacked expansion cards.
Figure 9B:
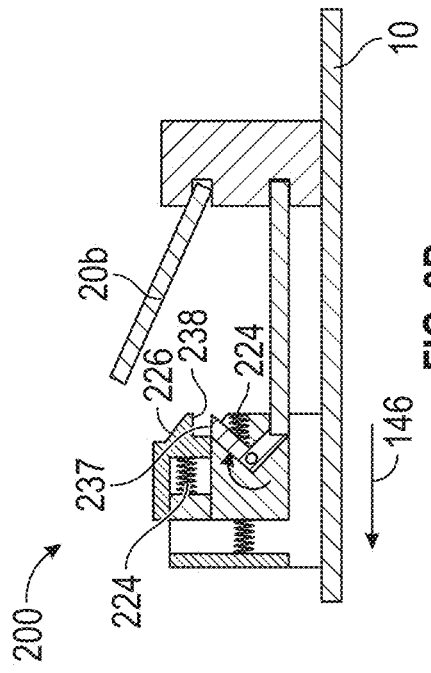
Figure 9C:
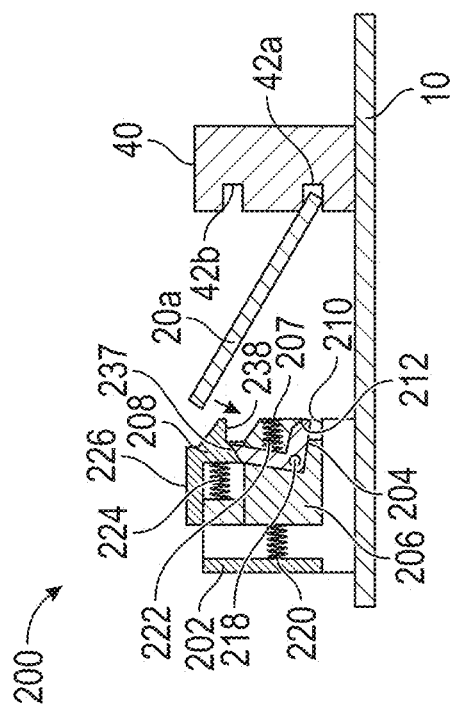
Figure 9D:
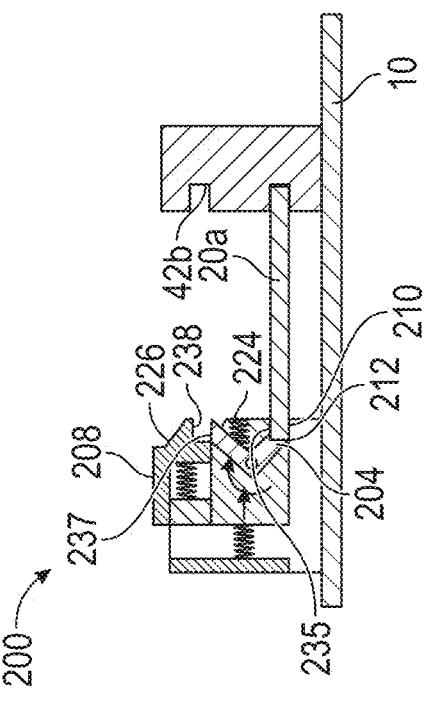
Figure 9F:
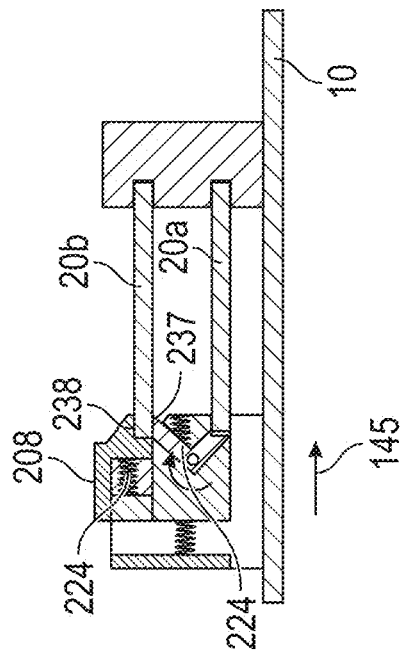

FIG. 9A . . . FIG. 9F are side views illustrating the installation of expansion cards in an embodiment of a latch 200 for retaining stacked expansion cards. In the embodiment of FIG. 9A, an arm 204 rotates when bottom board 20a is installed, which provides a base-face 237 -on which top board 20b rests when installed. Latch 200 is much like latch 100. This disclosure will illustrate the differences between the embodiments. The two embodiments are otherwise alike. In FIG. 9A, card 20a is initially inserted into a connector 42a of end connector 40. The other end 22 is then pressed in direction 144 against a lower latch face 207, which overcomes a spring 220 and causes a lower latch slider 206 to retract. As a result, card 20a travels down face 207 as shown in FIG. 9B. Eventually, card 20a encounters an edge 210 of a housing 202. As card 20a descends below face 207, spring 220 then urges lower latch slider 206 in direction 145, causing card 20a to abut and stop the travel of an arm face 212. However, card 20a does not initially stop the travel of lower latch slider 206. Thus, card 20a against arm face 212 causes an arm 204 to rotate in direction 147 against a spring 222 and about a pivot 218 until lower latch slider 206 abuts card 20a, as shown in FIG. 9C. FIG. 9C shows that the rotation of arm 204 has moved an arm face 237 into position below a lower edge 238 of an upper latch slider 208. Thus, the movement of lower latch slider 206 and the rotation of arm 204 have created an upper slot 236 between arm face 237 and lower face 238. Card 20a is now secured in place.

Figure 9E:
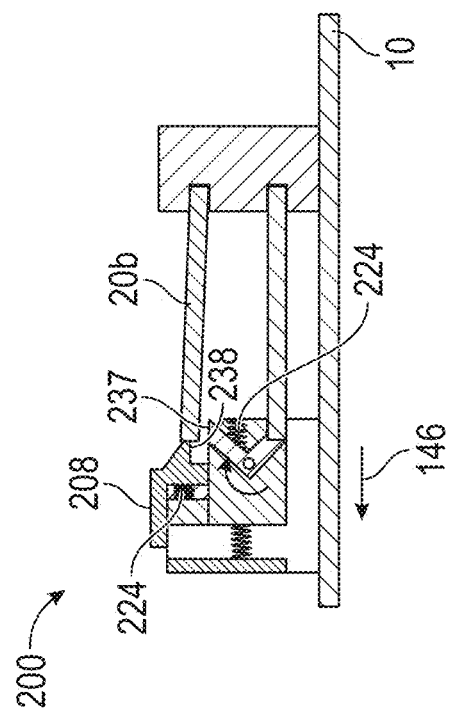

In FIG. 9C, card 20b is initially inserted into a connector 42b of end connector 40. The other end 22 of card 22b is then pressed in direction 144 against a chamfer 226 of upper latch slider 208, and caused to moved down chamfer 226 to the position of FIG. 9E. In that movement, the force behind the movement of card 22b overcomes the force of a spring 224 and moves upper latch slider 208 to a retracted position. FIG. 9F shows that end 22 of card 22b has been pushed further and dropped to rest on upper arm face 237. With card 20b resting on upper arm face 237, spring 224 has urged upper latch slider 208 in direction 145 such that card 20b is received between lower edge 238 and upper arm face 237 in upper slot 236. As shown in FIG. 9F, cards 20a, 20b are held in parallel to board 10. To release card 20b, grip 228 may be pushed in direction 146 to overcome spring 224 and retract lower edge 238 so that card 20b may be lifted out. Further force against grip 228 in direction 146 will overcome spring 220 and retract lower edge 235 so that card 20a may be lifted out. In addition, when card 20a is lifted out, spring 220 is free to force lower latch slider 206 to the extended and reset position shown in FIG. 9A.

Thus, embodiments generally provide an intuitive design that eliminates ambiguity by installing each card by pressing down.

The previous description is provided to enable any person skilled in the art to practice the various aspects described herein. In the embodiments, the separation of various system components in the embodiments described above should not be understood as requiring such separation in all embodiments. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

All structural and functional equivalents to the elements of the various aspects described throughout this disclosure that are known or later come to be known to those of ordinary skill in the art are expressly incorporated herein by reference and are intended to be encompassed by the claims.

What is claimed is:

1. An apparatus comprising:
a post connected to a cantilevered arm that flexes to enable the post to move between an extended post position and a retracted post position, the post being biased toward the extended post position;
a first slider configured to move between a first extended slider position and a first retracted slider position, the first slider being biased toward the first extended slider position and being retained in the first retracted slider position by the post when the post is in the extended post position;
a second slider configured to move in parallel with respect to the first slider between a second retracted slider position and a second extended slider position, the second slider being biased toward the second extended slider position; and
a first gap between part of the first slider and part of the second slider,
wherein a first section of the post extends, and is not covered by the first slider when the post is in the extended post position and the first slider is retained in the first retracted slider position, and wherein the first slider is no longer obstructed and the first slider moves from the first retracted slider position to the first extended slider position when the post is moved from the extended post position to the retracted post position.

2. The apparatus of claim 1, further comprising:
a first spring disposed between the first slider and a housing and providing a first spring force biasing the first slider toward the first extended slider position; and
a second spring disposed between the second slider and the first slider and providing a second spring force biasing the second slider toward the second extended slider position, wherein the second spring force is less than the first spring force such that, when the first slider is in the first extended slider position, the first slider maintains the first extended slider position as the second slider is moved from the second extended slider position to the second retracted slider position.

3. The apparatus of claim 2, wherein the first slider includes a first leg extending toward the cantilevered arm and, when the post is in the extended post position, the first slider is retained in the first retracted slider position by the first leg abutting the post.

4. The apparatus of claim 3, further including a first track associated with the housing, wherein the first slider is constrained to linear movement at least partly by the first track.

5. The apparatus of claim 4, wherein the second slider includes a second leg extending toward the cantilevered arm and travelling within a slot in the first slider when the second slider moves between the second extended slider position and the second retracted slider position.

6. The apparatus of claim 5, further including a second track associated with the housing, wherein the second slider is constrained to linear movement at least partly by the second track.

7. The apparatus of claim 6, wherein the second slider includes a face adjacent to the first gap and moves from the second extended slider position to the second retraced slider position when a first applied force is applied against the face and overcomes the second spring, and wherein the first slider moves from the first extended slider position to the first retracted slider position when a second applied force is applied against the face of the second slider and is greater than the first applied force and overcomes the first spring.

8. The apparatus of claim 7, wherein the second slider includes a chamfer disposed at an angle with respect to the face and part of a third applied force applied against the chamfer is redirected by the chamfer causing linear movement of the second slider.

9. The apparatus of claim 1, further comprising:
a board; and
a connector attached to the board and including a first connector slot and a second connector slot, wherein:
the post is connected to the board;
the first connector slot and the first gap are at a first distance from the board;
a second gap exists between part of the first slider and the post when the post is in the retracted post position; and
the second connector slot and the second gap are at a second distance from the board as measured from the board parallel to the first distance.

10. An apparatus comprising:
a housing;
an arm having a first arm face and a second arm face and being rotatable between a retracted arm position and an extended arm position, the arm being biased toward the retracted arm position;
a first slider movable between a first extended slider position and a first retracted slider position, the first slider being biased toward the first extended slider position;
a second slider moveable in parallel with respect to the first slider between a second retracted slider position and a second extended slider position, the second slider being biased toward the second extended slider position;
a first gap between part of the first slider and part of the second slider; and
a second gap between part of the housing and part of the first slider, wherein a section of the first arm face extends beyond an edge of the second gap when the arm is in the retracted arm position and the first slider is in the first extended slider position, and wherein the first arm face retracts toward a base of the second gap and the second arm face rotates to become parallel to an upper face of the first gap when the arm is moved from the retracted arm position to the extended arm position.

11. The apparatus of claim 10, further comprising:
a first spring disposed between the first slider and the housing and providing a first spring force biasing the first slider toward the first extended slider position;
a second spring disposed between the second slider and the first slider and providing a second spring force biasing the second slider toward the second extended slider position,
wherein the second spring force is less than the first spring force such that, when the first slider is in the first extended slider position, the first slider maintains the first extended slider position as the second slider is moved from the second extended slider position to the second retracted slider position.

12. The apparatus of claim 10, further including a first track associated with the housing, wherein the first slider is constrained to linear movement at least partly by the first track.

13. The apparatus of claim 12, wherein the second slider includes a leg travelling within a slot in the first slider when the second slider moves between the second extended slider position and the second retracted slider position.

14. The apparatus of claim 13, further including a second track associated with the housing, wherein the second slider is constrained to linear movement at least partly by the second track.

15. The apparatus of claim 14, wherein the second slider includes a slider face adjacent to the first gap and moves from the second extended slider position to the second retraced slider position when a first applied force is applied against the slider face and overcomes the second spring, and wherein the first slider moves from the first extended slider position to the first retracted slider position when a second applied force is applied against the slider face of the second slider and is greater than the first applied force and overcomes the first spring.

16. The apparatus of claim 15, wherein:
the second slider includes a chamfer disposed at an angle with respect to the slider face; and
part of a third applied force applied against the chamfer is redirected by the chamfer causing linear movement of the second slider.

17. The apparatus of claim 10, further comprising:
a board; and
a connector attached to the board and including a first connector slot and a second connector slot, wherein the housing is connected to the board and the first slider and second slider are configured such that:
an upper edge of the first connector slot and an upper edge of the first gap are at a first distance from the board;
an upper edge of the second connector slot and an upper edge of the second gap are at a second distance from the as measured from the board parallel to the first distance.

18. A method comprising:
causing, by movement of an end of a circuit board against an exposed section of a post connected to a cantilevered arm, the post to move to a retracted post position from an extended post position, the post being biased toward the extended post position;
causing a first slider to move to a first extended slider position from a first retracted slider position to retain the first end of the circuit board between a portion of the first slider and the post when the post is in the retracted post position, first slider being biased toward the first extended slider position and being retained in the first retracted slider position by the post when the post is in the extended post position; and
causing, by the movement of the first slider to the first extended slider position, a second slider to move a second extended slider position in parallel with respect to the first slider, the second slider configured to form a gap between part of the first slider and part of the second slider, the second slider being biased toward the second extended slider position,
wherein when the post is in the extended post position and the first slider is retained in the first retracted slider position, a first section of the post is exposed and is not covered by the first slider and wherein when the post is moved from the extended post position to the retracted post position, the first slider is released from the first retracted slider position to the first extended slider position.

19. The method of claim 18 further comprising:

causing, by movement of an end of a second circuit board against a face of the second slider, the second slider to move from the second extended slider position to a second a second retracted slider position; and causing, by further movement of the second circuit board, the end of the second circuit board to pass the face of the second slider, wherein, when the end of the second slider is past the face of the second slider, the second slider is released to return to the second extended slider position and receive the end of the second circuit board within the gap.

20. The method of claim 18 further comprising:

causing the first slider to be biased toward the first extended slider position by a first spring force from a first spring disposed between the first slider and a housing; and causing the second slider to be biased toward the second extended slider position by a second spring force from a second spring disposed between the second slider and the first slider, wherein the second spring force is less than the first spring force such that, when the first slider is in the first extended slider position, the first slider maintains the first extended slider position as the second slider is moved from the second extended slider position to the second retracted slider position.

\* \* \* \* \*